United States Patent
Doyle et al.

(10) Patent No.: US 6,744,288 B1
(45) Date of Patent: Jun. 1, 2004

(54) DRIVER WITH BULK SWITCHING MOS POWER TRANSISTOR

(75) Inventors: James Thomas Doyle, Nederland, CO (US); Michael Angelo Tamburrino, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/272,035

(22) Filed: Oct. 15, 2002

(51) Int. Cl.$^7$ ................................................. H03K 3/00

(52) U.S. Cl. ........................ 327/108; 327/112; 327/534

(58) Field of Search ......................... 327/108–112, 379, 327/382, 436, 437, 534, 535

(56) References Cited

PUBLICATIONS

Dragan Maksimovic, Bruno Kranzen, Sandeep Dhar and Ravindra Ambatipudi, U.S. patent application No. 10/053,226, filed Jan. 19, 2002, entitled "An Adaptive Voltage Scaling Digital Processing Component and Method of Operating the Same".

Bruno Kranzen and Dragan Maksimovic, U.S. patent application No. 10/053,227, filed Jan. 19, 2002, entitled "Adaptive Voltage Scaling Clock Generator for Use in a Digital Processing Component and Method of Operating the Same".

Dragan Maksimovic and Sandeep Dhar, U.S. patent application No. 10/053,828, filed Jan. 19, 2002, entitled "System for Adjusting a Power Supply Level of a Digital Processing Component and Method of Operating the Same".

Dragan Maksimovic, Ravindra Ambatipudi, Sandeep Dhar and Bruno Krazen, U.S. patent application No. 10/053,228, filed Jan. 19, 2002, entitled "An Adaptive Voltage Scaling Power Supply for Use in a Digital Processing Component and Method of Operating the Same".

James T. Doyle and Dragan Maksimovic, U.S. patent application No. 10/160,428, filed Mar. 26, 2002, entitled "Method and System for Minimizing Power Consumption in Mobile Devices Using Cooperative Adaptive Voltage and Threshold Scaling".

Dragan Maksimovic and James Thomas Doyle, U.S. patent application No. 10/166,822, filed Jun. 10, 2002, entitled "Serial Digital Communication Superimposed on a Digital Signal Over a Single Wire".

Dragan Maksimovic and Sandeep Dhar, U.S. patent application No. 10/236,482, filed Sep. 6, 2002, entitled "Method and System for Providing Self–Calibration for Adaptively Adjusting a Power Supply Voltage in a Digital Processing System".

Mark F. Rives, U.S. patent application No. 10/246,971, filed Sep. 19, 2002, entitled "Power Supply System and Method that Utilizes an Open Loop Power Supply Control".

Jim Doyle and Bill Broach, Small Gains in Power Efficiency Now, Bigger Gains Tomorrow [online]. Jul. 9, 2002 [retrieved on Feb. 1, 2003]. Retrieved from the Internet: <URL: http://www.commsdesign.com/design_corner/OEG20020709S0022>. pps. 1–5.

(List continued on next page.)

Primary Examiner—Kenneth Wells
(74) Attorney, Agent, or Firm—Mark C. Pickering

(57) ABSTRACT

A digital power supply system provides a supply voltage to semiconductor circuits. The power supply system utilizes a pulse width modulator to output a signal into a LC filter that generates a DC supply voltage. The width of the pulses output by the pulse width modulator are defined by an encoder that generates width information in response to a propagation delay detector that measures the propagation delay of a first clock signal when clocked by a second clock signal.

32 Claims, 7 Drawing Sheets

PUBLICATIONS

Robert W. Erickson and Dragan Maksimovic, *Fundamentals of Power Electronics,* Second Edition, Kluwer Academic Publishers, 2001, pp. 333.

Krisztian Flautner, Steven Reinhardt and Trevor Mudge, Automatic Performance Setting for Dynamic Voltage Scaling, Wireless Networks, vol. 8, Issue 5, Sep. 2002, pps. 507–520, and Citation, pps. 1–3, [online]. [retrieved on Feb. 2, 2003]. Retrieved from the Internet: <URL: http://portal.acm.org/citation.cfm?id=582455.582463&coll=portal&dl=ACM&idx=J804&p . . . >.

Krisztian Flautner, Steven Reinhardt and Trevor Mudge, Automatic Performance Setting for Dynamic Voltage Scaling [online]. May 30, 2001, [retrieved on Feb. 2, 2003]. Retrieved from the Internet: <URL: http://www.eecs.umich.edu/~tnm/papers/mobicom01.pdf>. pps. 1–12.

Texas Instruments, "Synchronous–Buck PWM Controller With NMOS LDO Controller", TPS5110, SLVS025A–Apr. 2002, Revised Jun. 2002.

Joonho Gil, Minkyu Je, Jongho Lee and Hyungcheol Shin, "A High Speed and Low Power SOI Inverter Using Active Body–Bias", Association of Computing Machinery, ISLPED98, Monterey, CA, 1998, pps. 59–63.

Oliver Weinfurtner, Switcher Output Stages on Neptune 28 (CMOS7–5), Neptune 28 Output Stage Results, Sep. 24, 2001, pps. 1–8.

Intel XScale Core, Developer's Manual, Dec. 2000, [online], [retrieved on Feb. 2, 2003]. Retrieved from the Internet: <URL: http://developer.intel.com/design/intelxscale/27347301.pdf>. pps. 1–1 through B–1.

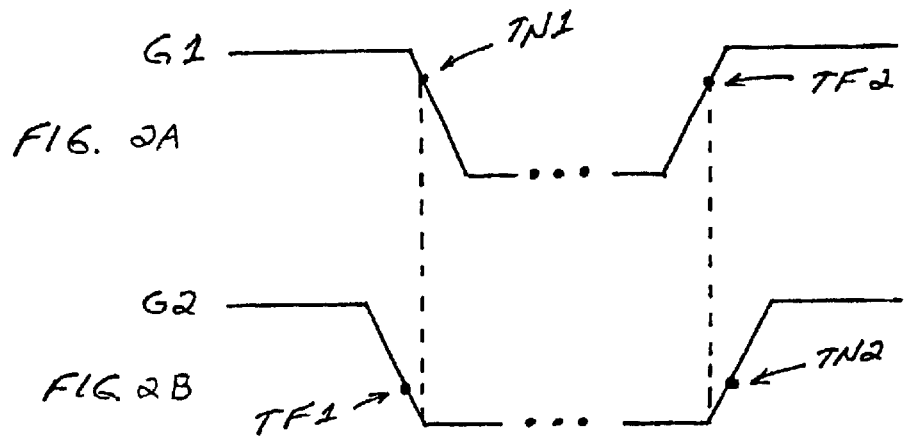
FIG. 2A
FIG. 2B
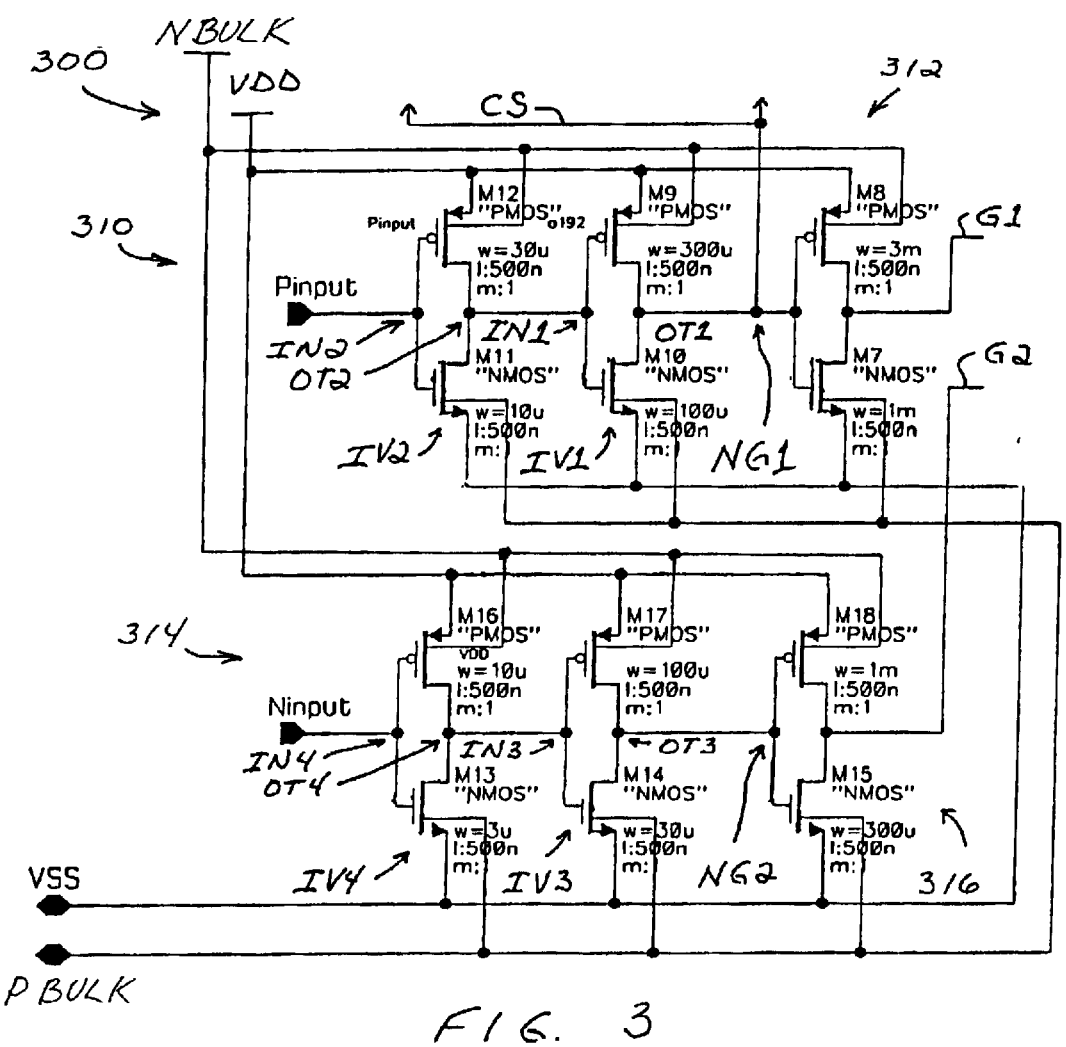
FIG. 3

DRIVER WITH BULK SWITCHING MOS POWER TRANSISTOR

RELATED APPLICATION

The present invention is related to application Ser. No. 10/272,027 for "All Digital Power Supply System and Method that Provides a Substantially Constant Supply Voltage over Changes in PVT Without a Band Gap Reference Voltage" by James Thomas Doyle and Dae Woon Kang, and application Ser. No. 10/272,028 for "Level Translator for High Voltage Digital CMOS Process" by James Thomas Doyle, both filed on an even date herewith.

BACKGROUND OF THE INVENTION

1. Field of the Invention

The present invention relates to drivers and, more particularly, to a driver with a bulk switching MOS power transistor.

2. Description of the Related Art

A MOS transistor is a well-known circuit device that controllably varies the current that flows between a source region and a drain region. A MOS power transistor is a larger MOS transistor that is capable of handling much larger magnitudes of current. A driver is another well-known circuit device that utilizes a PMOS power transistor and an NMOS power transistor.

The PMOS transistor has a source connected to a voltage source, and a drain connected to an output node. In addition, the PMOS transistor has a gate, and an n-bulk that is connected to the voltage source. The NMOS transistor has a source connected to ground, and a drain connected to the output node. Further, the NMOS transistor has a gate, and a p-bulk that is connected to ground.

In operation, when an input signal transitions from a logic low to a logic high, the PMOS transistor turns off and the NMOS transistor turns on. As a result, the NMOS transistor pulls the output node to ground. On the other hand, when the input signal transitions from a logic high to a logic low, the NMOS transistor turns off and the PMOS transistor turns on. As a result, the PMOS transistor pulls the output node up to approximately the voltage source.

One of the advantages of the above-described driver is that only one transistor is on when the input logic state is either a logic high or a logic low. To minimize leakage current when the PMOS and NMOS transistors are turned off, the n-bulk and p-bulk, respectively, are held at the voltage source and ground, respectively.

SUMMARY OF THE INVENTION

The present invention provides a driver with a bulk switching MOS power transistor. A driver in accordance with the present invention includes a p-channel MOS transistor that has a p+ source connected to a supply voltage, a p+ drain connected to a first node, a gate, and an n-bulk connected to a second node.

In addition, the driver further includes an n-channel MOS transistor that has an n+ source connected to ground, an n+ drain connected to the first node, a gate, and a p-bulk connected to a p-bulk voltage. Further, the driver includes a gate signal generator that outputs a PMOS gate signal to the gate of the p-channel MOS transistor, an NMOS gate signal to the gate of the n-channel MOS transistor, and a control signal. The PMOS and NMOS gate signals are non-overlapping.

The driver also includes a first switch that is connected to ground, the control signal, and the n-bulk of the p-channel MOS transistor via the second node. The driver additionally includes a second switch connected to ground and the control signal, and a resistor that is connected to the n-bulk of the p-channel MOS transistor. A current flows through the resistor to ground when the second switch is closed, and does not flow through the resistor when the second switch is open.

The present invention also includes a method of driving a signal with the driver. The method includes the steps of turning off the n-channel MOS transistor, turning on the p-channel MOS transistor after the n-channel MOS transistor has been turned off, and connecting the n-bulk to ground via the resistor when the p-channel MOS transistor is on.

The method can also include the steps of turning off the p-channel MOS transistor, connecting the n-bulk to a voltage greater than ground when the p-channel transistor is off, and turning on the n-channel MOS transistor.

The present invention also includes a MOS transistor that includes a plurality of first strips of a first conductivity type. A first strip has a width that varies with length from a first width to a second larger width to the first width. The MOS transistor also includes a plurality of second strips of the first conductivity type. A second strip has a width that varies with length from a third width to a fourth smaller width to the third width. A line normal to the lengths of the first strip and the second strip passes through the first width and the third width. The third width is larger than the first width.

The MOS transistor additionally includes a plurality of channel region strips. A channel region strip is located between adjacent first and second strips. The channel region strip has a shape that varies with length. The shape is defined by the adjacent first and second strips. Further, the MOS transistor includes a plurality of gate strips. A gate strip is formed over each channel region strip. The gate strip has a shape that varies with length and substantially matches the shape of the channel region strip.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 2A–2B are timing diagrams illustrating the operation of gate signal generator 110 in accordance with the present invention.

7A is a plan view, while FIG. 7B is a cross-sectional view taken along lines 7B—7B of FIG. 7A.

FIG. 8A is a plan view, while FIG. 8B is a cross-sectional view taken along lines 8B—8B of FIG. 8A.

DETAILED DESCRIPTION

Figure 1:
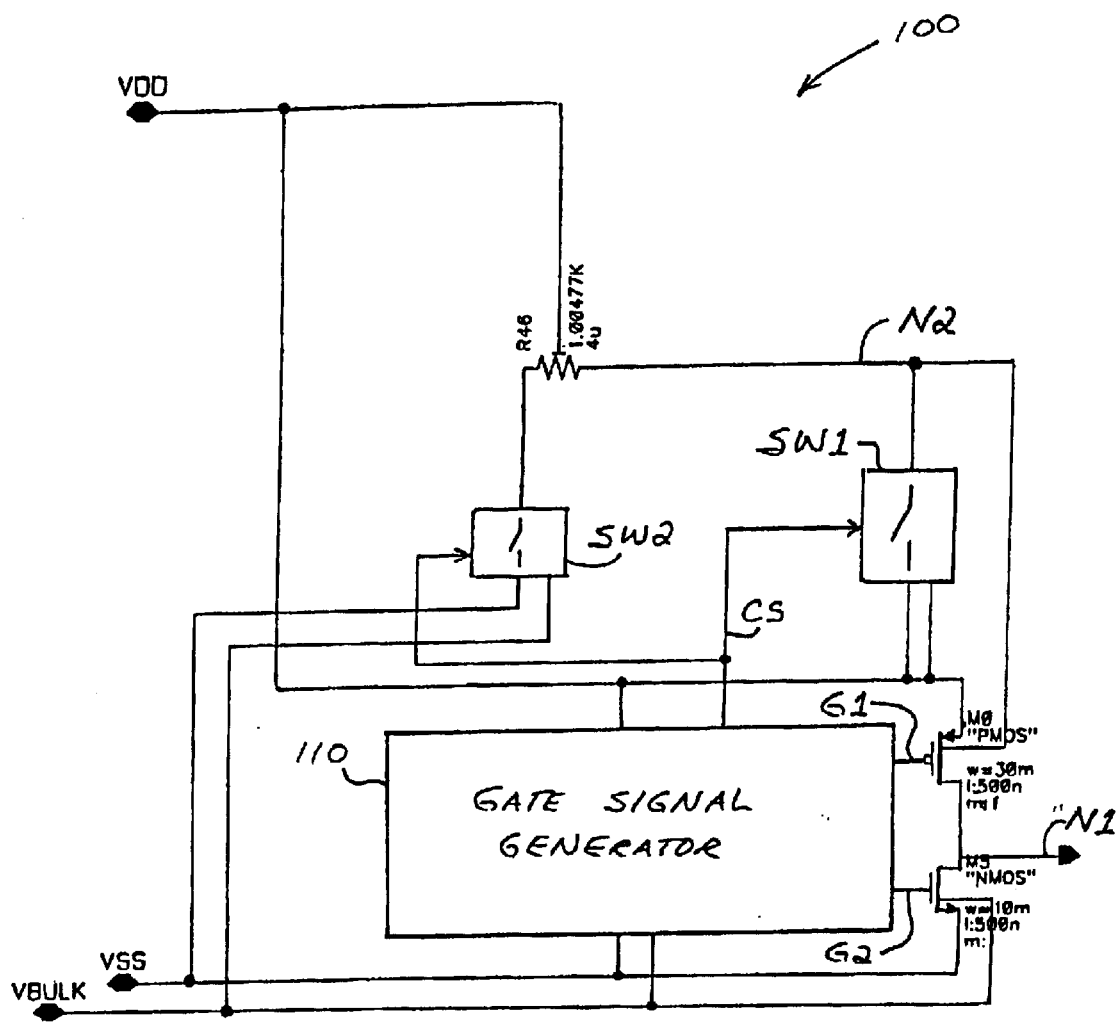
FIG. 1 is a block diagram illustrating an example of a driver stage 100 in accordance with the present invention.

FIG. 1 shows a block diagram that illustrates an example of a driver stage 100 in accordance with the present invention. As shown in FIG. 1, driver stage 100 includes a p-channel MOS transistor M0 that has a p+ source connected to a supply voltage VDD, and a p+ drain connected to a first node N1. In addition, PMOS transistor M0 has a gate, and an n-well connected to a second node N2.

Driver stage 100 also has an n-channel MOS transistor M5 that has an n+ source connected to ground VSS, and an n+ drain connected to first node N1. In addition, NMOS transistor M5 has a gate, and a p– substrate connected to a bulk voltage VBULK. PMOS transistor M0 is a large driver transistor that sources a large current to first node N1, while NMOS transistor M5 a large driver transistor that sinks a large current from first node N1.

As further shown in FIG. 1, driver stage 100 includes a gate signal generator 110 that outputs a PMOS gate signal G1 to transistor M0, an NMOS gate signal G2 to transistor M5, and a control signal CS. Gate signals G1 and G2 are non-overlapping, while control signal CS can be implemented as the inverse of gate signal G1.

FIGS. 2A–2B show timing diagrams that illustrate the operation of gate signal generator 110 in accordance with the present invention. As shown in FIGS. 2A–2B, gate signal generator 110 outputs the gate signals G1 and G2 so that the voltage on gate signal G2 is equal to or less than a turn off voltage TF1 (that turns off transistor M5) before the voltage on gate signal G1 is equal to a turn on voltage TN1 (that turns on transistor M0). Similarly, the voltage on gate signal G1 is equal to or greater than a turn off voltage TF2 (that turns off transistor M0) before the voltage on gate signal G2 is equal to a turn on voltage TN2 (that turns on transistor M5).

The turn off voltages TF1 and TF2 turn off transistors M5 and M0, respectively, such that no current flows out of the drains of the transistors (other than a very small leakage current). The turn on voltages TN1 and TN2 turn on transistors M0 and M5, respectively, such that a current in excess of a leakage current flows out of the drains of the transistors.

Thus, as shown in FIGS. 2A–2B, gate signal generator 110 prevents transistors M0 and M5 from being turned on at the same time. By preventing transistors M0 and M5 from being turned on at the same time, gate signal generator 110 saves the power that would be wasted if transistor M5 sunk current directly from transistor M0.

Figure 3:
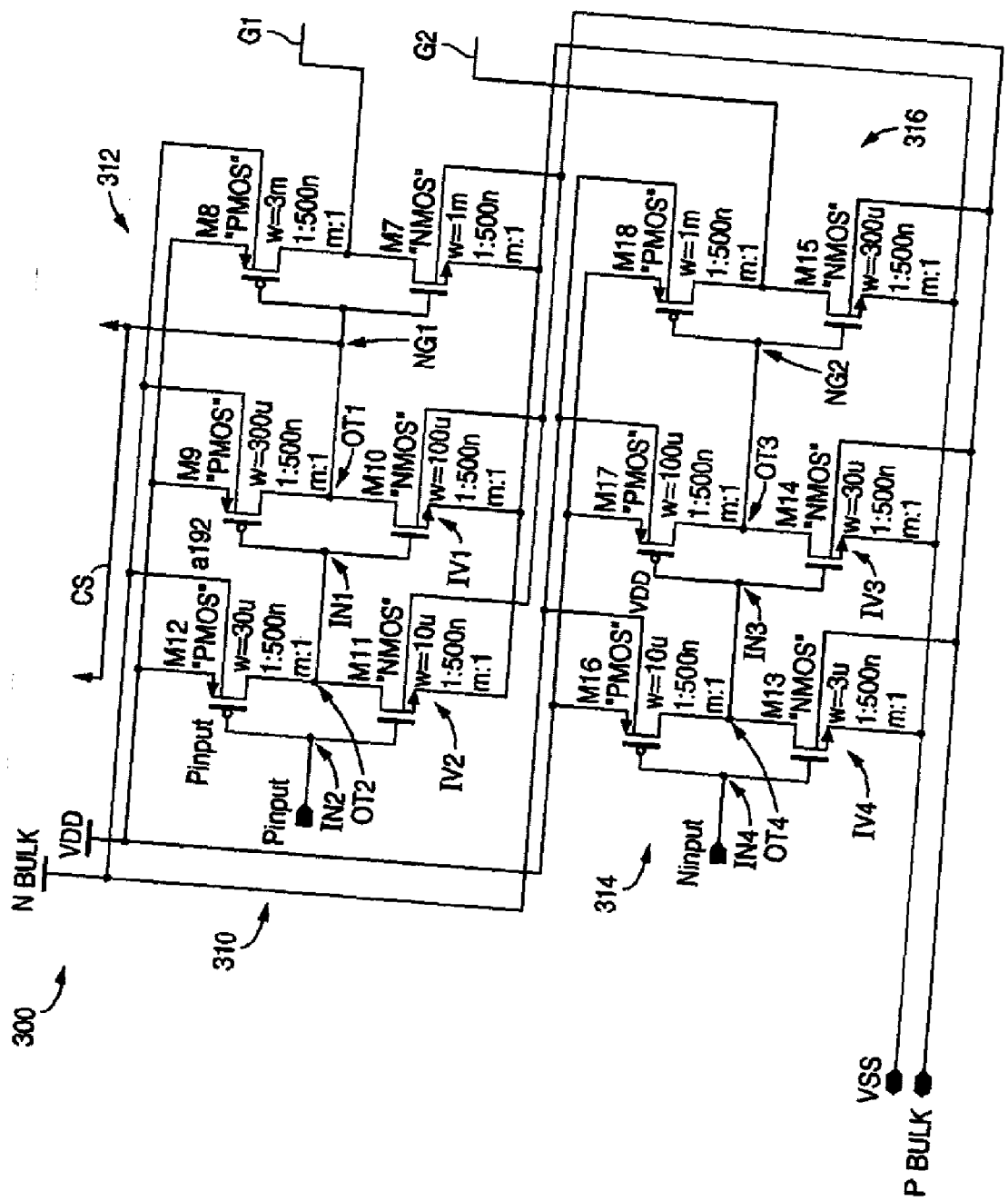
FIG. 3 is a circuit diagram illustrating an example of a gate signal generator 110 in accordance with the present invention.
Figure 5:
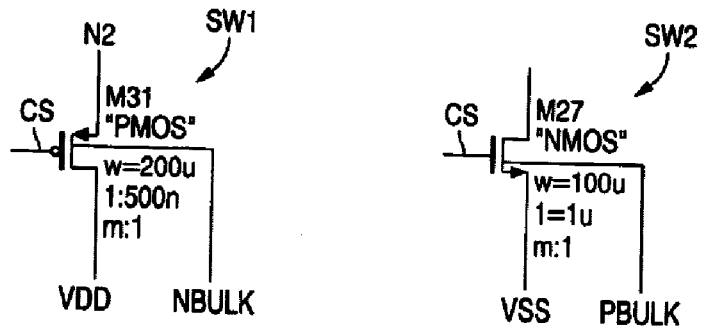
Figure 5:
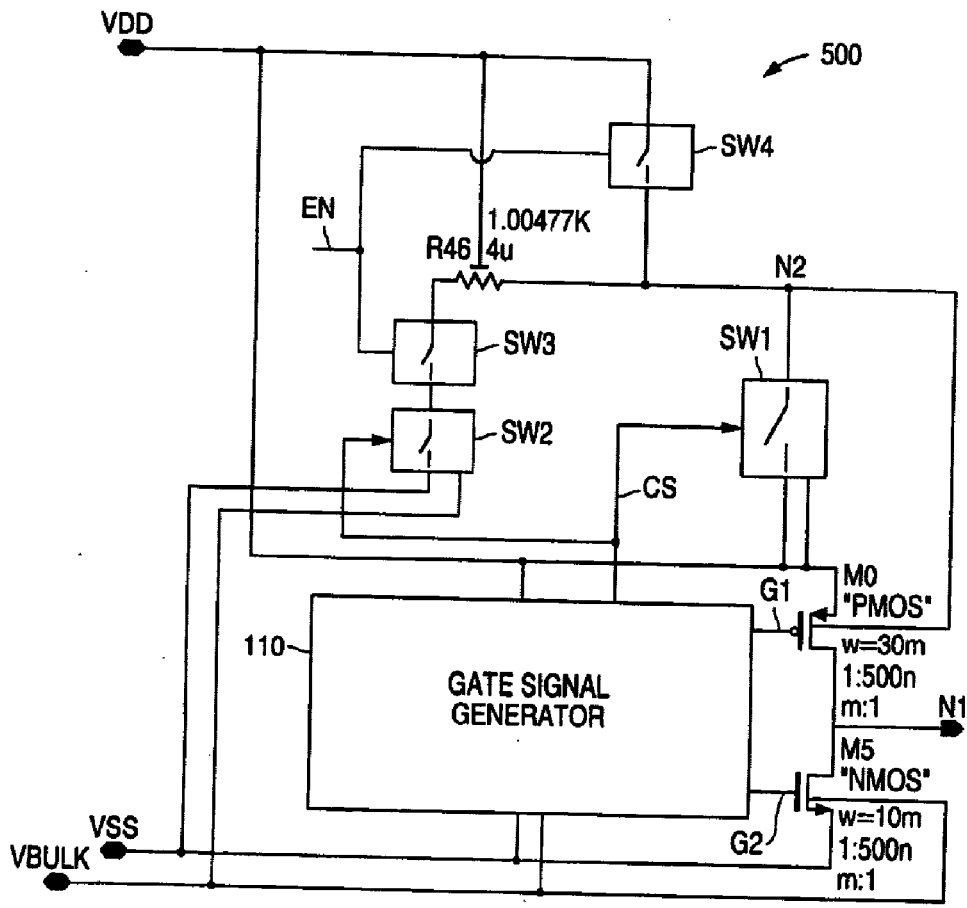
Figure 6A:
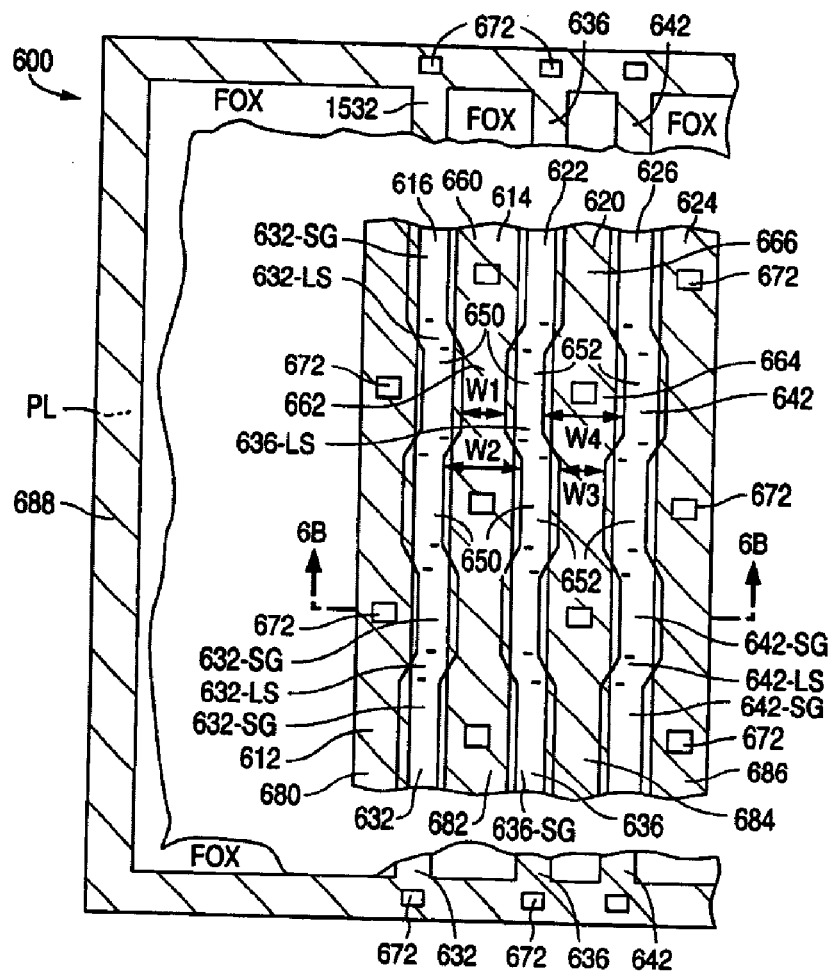
Figure 6B:
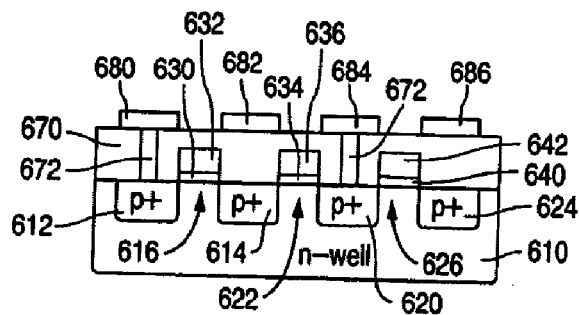
Figure 7A:
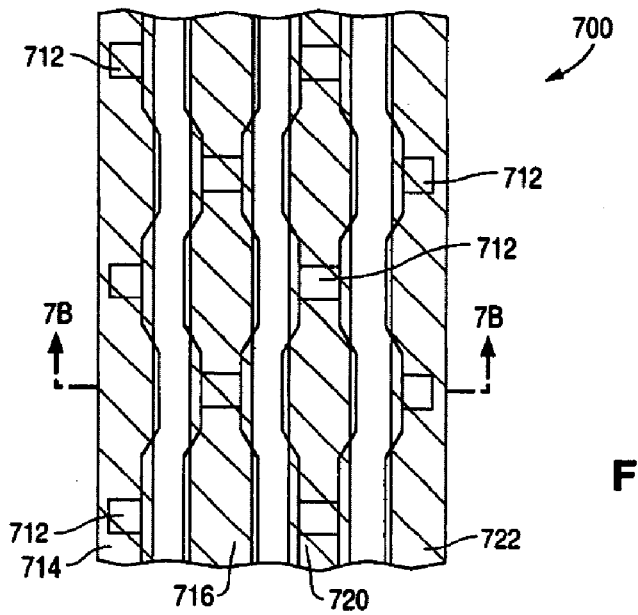
Figure 7B:
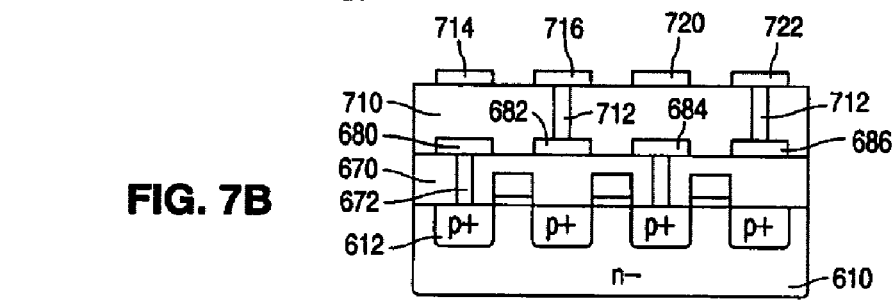
Figure 9:
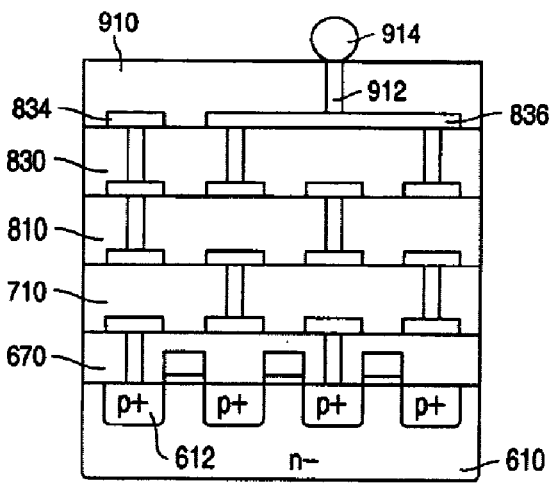
Figure 8A:
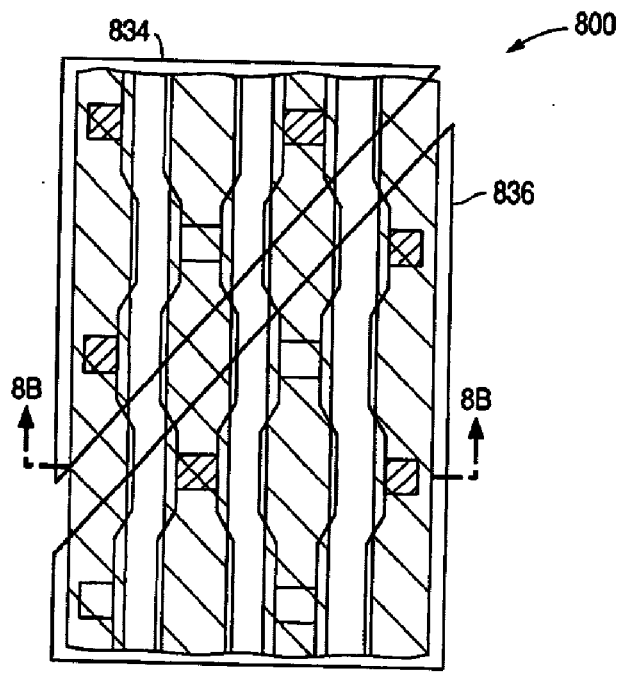
Figure 8B:
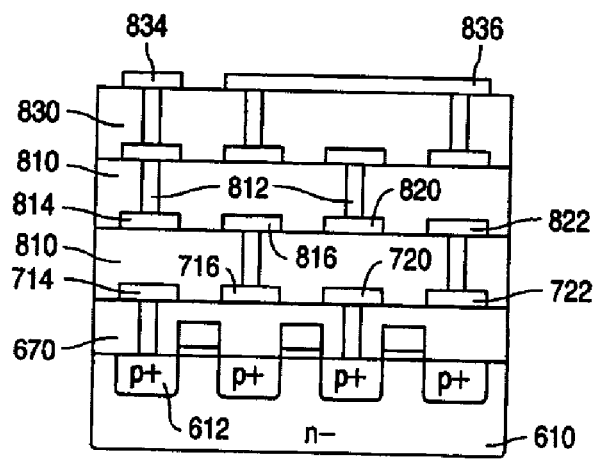

FIG. 3 shows a circuit diagram that illustrates an example of a gate signal generator 300 in accordance with the present invention. As shown in FIG. 3, gate signal generator 300 has a p-channel delay path 310 that includes a p-path inverter 312, and an n-channel delay path 314 that includes an n-path inverter 316.

P-path inverter 312 includes a PMOS transistor M8 and a NMOS transistor M7 that have gates connected to a gate node NG1 and drains that are connected to the gate of transistor M0. In addition, in this example, the control signal CS is taken from the p-path 310 and output from the gate node NG1.

Further, as shown in FIG. 3, p-path 310 can include additional inverters that are connected in series. For example, p-path 310 can include inverter IV1, which is formed from transistors M9/M10, that has an input IN1 and an output OT1 that is connected to the gate node NG1. In addition, path 310 can include an inverter IV2, which is formed from transistors M11/M12, that has an input IN2 and an output OT2 that is connected to input IN1.

N-path inverter 316 includes a PMOS transistor M18 and an NMOS transistor M15 that have gates connected to a gate node NG2 and drains that are connected to the gate of transistor M5. Further, as shown in FIG. 3, n-path 314 can include additional inverters that are connected in series.

For example, n-path 314 can include inverter IV3, which is formed from transistors M14/M17, that has an input IN3 and an output OT3 that is connected to the gate node GN2. In addition, path 314 can include an inverter IV4, which is formed from transistors M13/M16, that has an input IN4 and an output OT4 that is connected to input IN3.

The transistors in the p-channel and n-channel delay paths 310 and 314 are sized to provide the required edge timing shown in FIG. 2. For example, in the FIG. 3 embodiment, p-channel transistor M8 is 3X larger than p-channel transistor M18. As a result, transistor M8 sources 3× more current than transistor M18 which, in turn, allows transistor M8 to raise the voltage on the gate of transistor M0 faster than transistor M18 can raise the voltage on the gate of transistor M5.

Returning again to FIG. 1, driver stage 100 additionally includes a first switch SW1 that is connected to the control signal CS, and the well of transistor M0 via node N2; and a second switch SW2 that is connected to ground VSS and the control signal CS. In addition, driver stage 100 includes a resistor R46 that is connected to the well of transistor M0 via node N2 and to switch SW2.

Figure 4A:
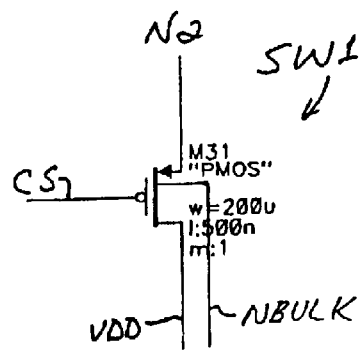
FIGS. 4A and 4B are circuit diagrams illustrating examples of switches SW1 and SW2, respectively, in accordance with the present invention.
Figure 4B:
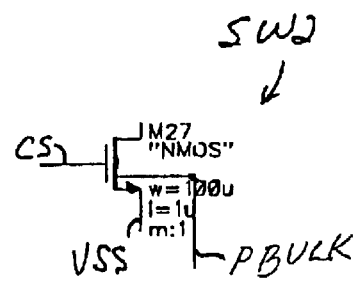

FIGS. 4A and 4B show circuit diagrams that illustrate an example of switches SW1 and SW2, respectively, in accordance with the present Invention. As shown in FIG. 4A, switch SW1 can be implemented as a p-channel MOS transistor M31 that has a p+ source connected to the n-well of PMOS transistor M0 via node N2 and a p+ drain connected to the supply voltage VDD. In addition, transistor M31 has a gate connected to the control signal CS, and a well connected to an n bulk voltage NBULK.

As shown in FIG. 4B, switch SW2 can be implemented as an n-channel MOS transistor M27 that has an n+ source connected to ground VSS and an n+ drain connected to resistor R. In addition, transistor M27 has a gate connected to the control signal CS, and a substrate connected to a p bulk voltage PBULK.

In operation, driver stage 100 sinks current from node N1 when transistor M0 is turned off and transistor M5 is turned on. Transistor M5 turns on when the voltage of gate signal G2 rises such that the gate-to-source voltage is greater than the threshold voltage of transistor M5.

The voltage of gate signal G1 also rises to turn off transistor M0. At the same time, the control signal CS, which is the inverse of the gate signal G1, falls. The falling control signal CS, in turn, closes switch SW1 and opens switch SW2. When switch SW1 closes, the voltage on the well of transistor M0 is pulled up to approximately the supply voltage VDD.

In addition, driver stage 100 sources current into node N1 when transistor M0 is turned on and transistor M5 is turned off. Transistor M0 turns on when the voltage on gate signal G1 falls such that the gate-to-source voltage is less than the threshold voltage of transistor M0.

At the same time, the control signal CS, which is the inverse of the gate signal G1, rises. The rising control signal CS opens switch SW1 and closes switch SW2. When switch SW2 closes, the voltage on the well of transistor M0 is pulled down towards ground via a trickle of current that flows through resistor R46.

With respect to the examples shown in FIGS. 3, 4A, and 4B, the control signal CS goes low when the gate signal G1 goes high to turn off transistor M0, thereby turning off transistor M27 and turning on transistor M31. When transistor M31 turns on, the voltage on the well of transistor M0 is pulled up to approximately the supply voltage VDD.

On the other hand, the control signal CS goes high when the gate signal G1 goes low to turn on transistor M0, thereby turning off transistor M31 and turning on transistor M27. When transistor M27 turns on, the voltage on the well of transistor M0 is pulled down towards ground via a trickle of current that flows through resistor R46.

Thus, the present invention provides a bulk switching that pulls down the voltage on the n bulk of PMOS transistor M0 when transistor M0 is turned on, and pulls up the voltage on the n bulk of transistor M0 when transistor M0 is turned off. By pulling the n bulk down during the on state, the threshold voltage of transistor M0 can be increased by several hundred millivolts.

Since the threshold voltage of transistor M0 can be reduced, driver stage 100 can operate at a lower supply voltage and, therefore, requires less power to operate. In addition, by pulling the n bulk up during the off state, the lower leakage current associated with a high n bulk can be realized.

Further, since PMOS transistor M0 is a driver transistor, transistor M0 is a high-voltage transistor that has a threshold voltage of about —1V. For a low-voltage supply, e.g., 2.6V, a 0.3V or 0.4V improvement in the threshold voltage provides about a 10% total improvement in the drain-to-source turn on resistance of PMOS transistor M0. This, in turn, reduces the silicon area that is required by PMOS transistor M0 by about 10% since the transconductance is a linear function of the gate voltage in the linear and subthreshold region.

Figure 5:
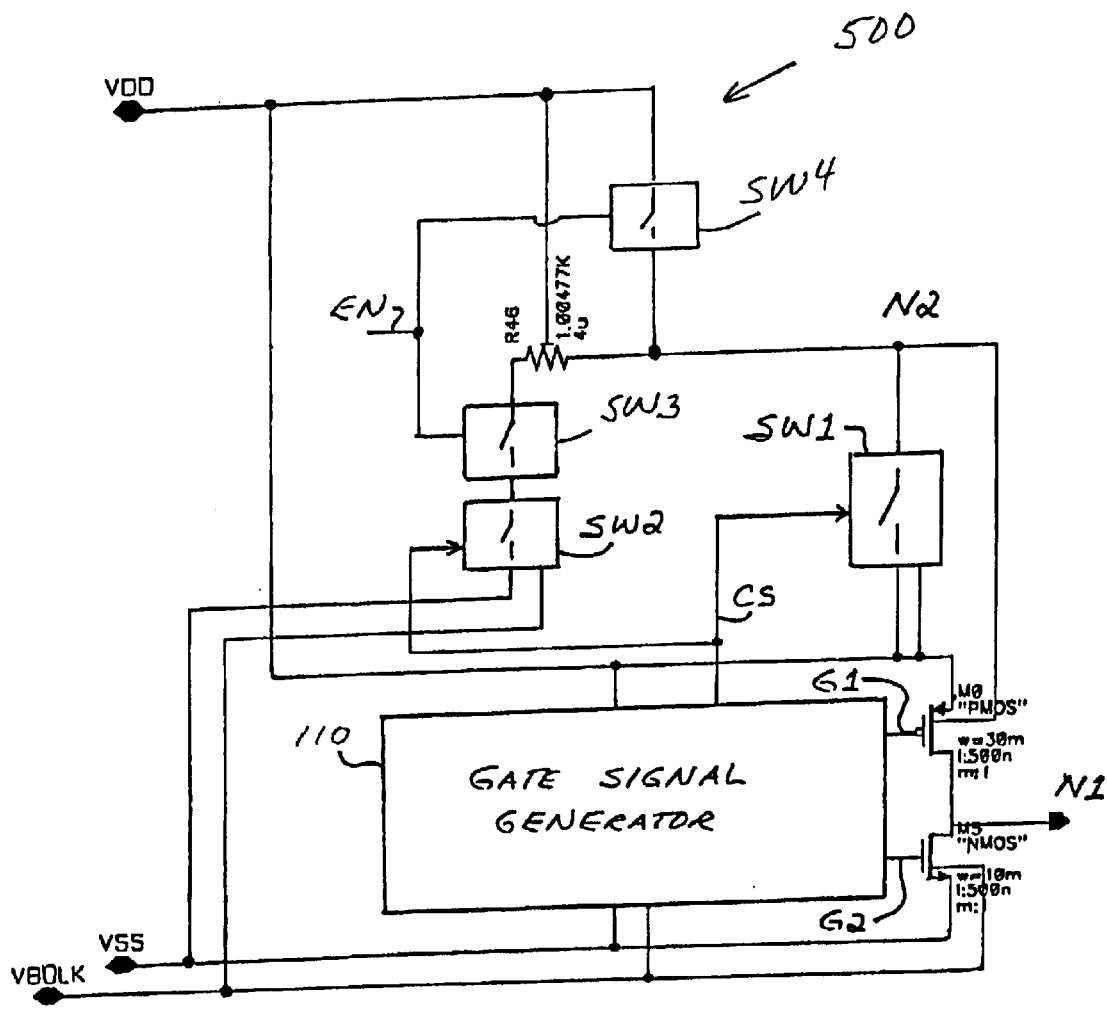
FIG. 5 is a circuit diagram illustrating an output stage 500 in accordance with an alternate embodiment of the present invention.

FIG. 5 shows a circuit diagram that illustrates a driver stage 500 in accordance with an alternate embodiment of the present invention. Stage 500 is similar to stage 100 and, as a result, utilizes the same reference numerals to designate the structures which are common to both stages.

As shown in FIG. 5, stage 500 differs from stage 100 in that stage 500 includes a third switch SW3 that is connected to and between the well of PMOS transistor M0 and the supply voltage VDD, and controlled by an enable signal EN. Switch SW3 can be implemented with, for example, PMOS transistor M31. In this case, the source and well of transistor M31 are connected to the supply voltage, the drain to node N2, and the gate to the enable signal EN.

As further shown in FIG. 5, stage 500 additionally includes a fourth switch SW4 that is connected to and between resistor R and switch SW2, and controlled by the enable signal EN. Switch SW4 can be implemented with, for example, NMOS transistor M27. In this case, the source is connected to switch SW2, the drain is connected to resistor R46, and the gate is connected to the enable signal EN.

In operation when the enable signal EN is a logic low, switch SW3 is open while switch SW4 is closed. When switch SW4 is closed, the voltage on the well of PMOS transistor M0 is pulled up to about the supply voltage VDD and held there as transistor M0 is turned on and off.

On the other hand, when the enable signal EN is a logic high, switch SW3 is closed, while switch SW4 is open. When switch SW3 is closed and switch SW4 is open, stage 500 operates the same as stage 100. Thus, stage 500 provides an enable capability that allows the voltage on the n-well of PMOS transistor M0 to be held high rather than be switched low when transistor M0 turns on.

The enable signal EN can be used in a number of different ways. For example, the enable signal EN can be used to form a driver with an adjustable PMOS threshold voltage. When the enable signal EN is deasserted and the n bulk is held high, PMOS transistor M0 has a first threshold voltage, e.g., –1V.

On the other hand, when the enable signal EN is asserted and the bulk switching is enabled, PMOS transistor M0 has a second threshold voltage, e.g., –0.8V, that is higher than the first threshold voltage. In addition, the enable signal EN allows the bulk switching to be disabled for use in high voltage applications, and can be used with a clock signal to turn the bulk switching on and off.

In addition, rather than connecting switch SW1 to the supply voltage VDD, switch SW1 can alternately be connected to a voltage source that is higher than the supply voltage VDD. In this embodiment, the threshold voltage of PMOS transistor M0 can be lowered even further when the bulk switching is enabled.

Figure 6A:
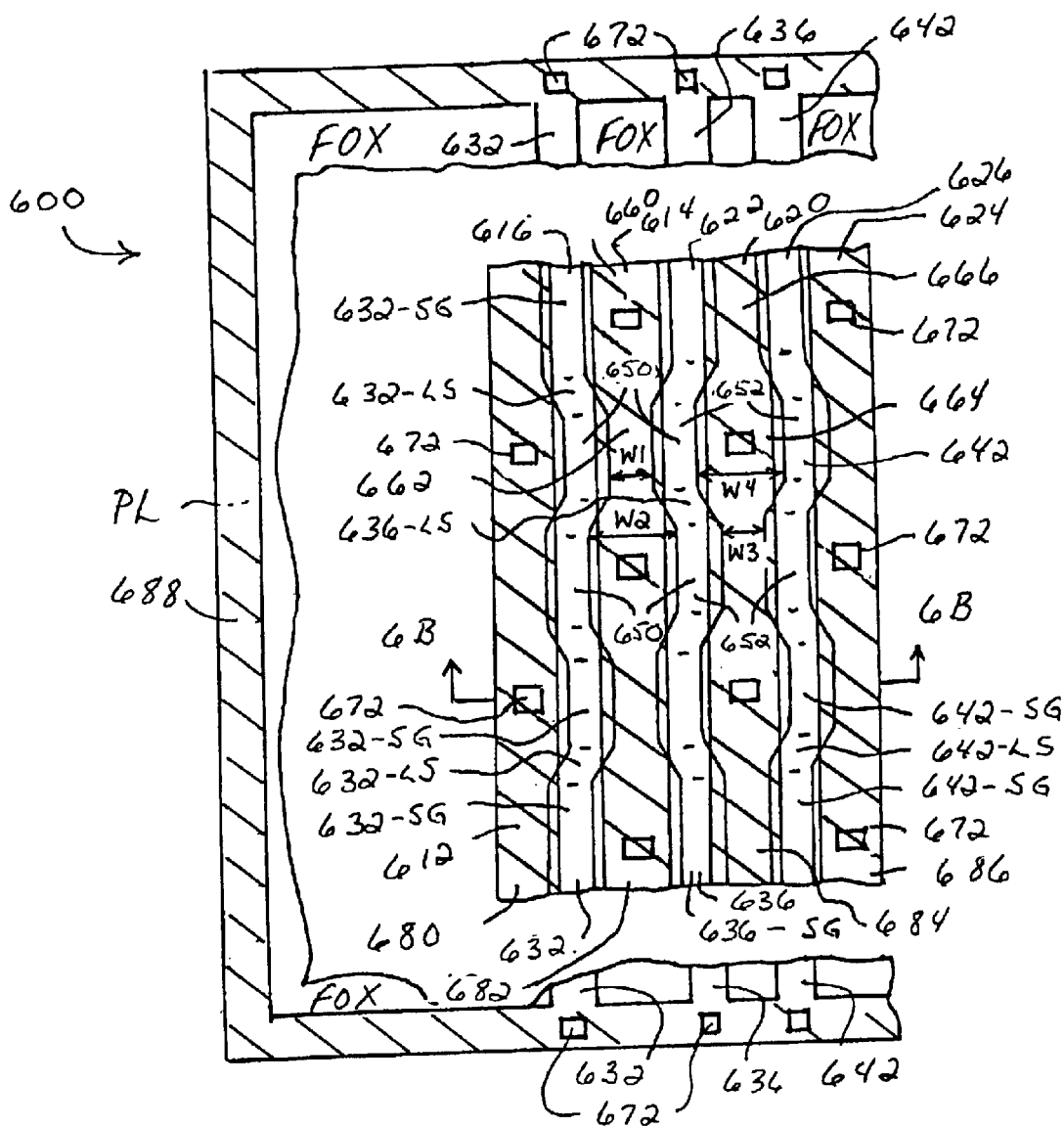
FIGS. 6A–6B are two views illustrating a layout 600 of PMOS transistor M0 after the metal-1 layer has been formed and patterned in accordance with the present invention.
Figure 6B:
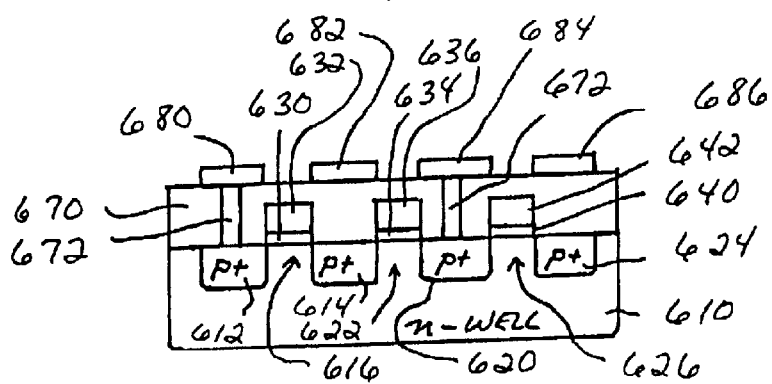

FIGS. 6A–6B show two views that illustrate a layout 600 of PMOS transistor M0 after the metal-1 layer has been formed and patterned in accordance with the present invention. FIG. 6A shows a plan view, while FIG. 6B shows a cross-sectional view taken along lines 6B—6B of FIG. 6A. As shown in FIGS. 6A–6B, layout 600 includes an n-well 610, and a strip of a p+ source region 612 that is formed in an n-well 610.

Layout 600 also includes a strip of a p+ drain region 614 that is formed in an n-well 610 a distance apart from source region 612, and a channel region 616 that is located between source and drain regions 612 and 614. Layout 600 further includes a strip of a p+ source region 620 that is formed in an n-well 610 a distance apart from drain region 614, and a channel region 622 that is located between source and drain regions 620 and. 614.

Further, layout 600 includes a strip of a p+ drain region 624 that is formed in an n-well 610 a distance apart from source region 620, and a channel region 626 that is located between source and drain regions 620 and 624. Additional strips of p+ source and drain regions can be used to increase the size of transistor M0.

As shown in FIGS. 6A–6B, layout 600 further includes a layer of gate oxide 630 that is formed over channel region 616, and a polysilicon gate strip 632 that is formed on oxide layer 630 over channel region 616. In addition, both ends of polysilicon gate strip 632 extend out over a field oxide region FOX.

A layer of gate oxide 634 is also formed over channel region 622, and a polysilicon gate strip 636 is formed on oxide layer 634 over channel region 622. Both ends of polysilicon gate strip 636 also extend out over the field oxide region FOX. A layer of gate oxide 640 is further formed over channel region 626, and a polysilicon gate strip 642 is formed on oxide layer 640 over channel region 626. Both ends of polysilicon gate strip 642 extend out over the field oxide region FOX. As further shown in FIG. 6A, polysilicon gate strips 632, 636, and 642 on both ends are connected together via a polysilicon interconnect line PL.

Gate strip 632 has a number of segments 632-SG, and a number of linking sections 632-LS that connect together adjacent segments 632-SG. Similarly, gate strip 636 has a number of segments 636-SG, and a number of linking sections 636-LS that connect together adjacent segments 632-SG. Gate strip 642 also has a number of segments 642-SG, and a number of linking sections 642-LS that connect together adjacent segments 642-SG.

In addition, the segments 632-SG of gate strip 632, the segments 636-SG of gate strip 636, and the segments 642-SG of gate strip 642 are substantially parallel. Each segment 632-SG of gate strip 632 also has a corresponding segment 636-SG of gate strip 636.

Each segment 632-SG and the corresponding segment 636-SG form a segment pair 650 that has a width measured substantially normal to both segments 632-SG and 636-SG. Further, the width of each adjacent segment pair 650 alternates between a first width W1 and a second width W2 that is wider than first width W1.

In addition, each segment 636-SG of gate strip 636 has a corresponding segment 642-SG that lies a distance apart. Each segment 636-SG and the corresponding segment 642-SG form a segment pair 652 that has a width measured substantially normal to both segments 636-SG and 642-SG.

Further, the width of each adjacent segment pair 652 alternates between a third width W3 and a fourth width W4 that is wider than third width W3. In addition, each segment pair 650 has a corresponding and adjoining segment pair 652. When a segment pair 650 has the second width, the corresponding segment pair 652 has the third width. Similarly, when a segment pair 650 has the first width, the corresponding segment pair 652 has the fourth width.

As shown in FIG. 6A, a number of adjacent segment pairs 650 forms an alternating series of wide and narrow regions 660 and 662, respectively, while a number of adjacent segment pairs 652 forms an alternating series of wide and narrow regions 664 and 666, respectively.

In addition to the above, layout 600 also includes a layer of isolation material 670, and a number of contacts 672 that are formed through isolation material 670 to make an electrical connection with source strip 612, drain ship 614, source strip 620, drain strip 624, and interconnect line PL. The contacts 672, in turn, are formed generally in the middle of each wide region 660 and 664, and periodically on interconnect line PL.

Further, layout 600 includes a plurality of strips of metal-1 that include a source strip 680, a drain strip 682, a source strip 684, a drain strip 686, and an interconnect strip 688. Source strip 680 is formed on isolation material 670 to make electrical contact with the contacts 672 that make an electrical connection with p+ source strip 612.

Drain strip 682 is formed on isolation material 670 to, make electrical contact with the contacts 672 that make an electrical connection with p+ drain strip 614. Source strip 684 is formed on isolation material 670 to make electrical contact with the contacts 672 that make an electrical connection with p+ source strip 620.

Drain strip 686 is formed on isolation material 670 to make electrical contact with the contacts 672 that make an electrical connection with p+ drain strip 624. Interconnect strip 688 is formed on isolation material 670 to make electrical contact with the contacts 672 that make an electrical connection with polysilicon interconnect line PL which, in turn, is connected to gate strips 632, 636, and 642.

Thus, in accordance with the present invention, a layout has been described that utilizes a plurality of serrated gate structures that allow the source and drain regions to contacted frequently. The result is a 25% savings in space over conventional layouts.

In addition, picking up the gate strips on both ends with a layer of interconnect polysilicon and a metal-1 strip reduces the distributed RC delay associated with the gate strips (the resistance of the polysilicon strips and the capacitance under the gate strips) by a factor of two to three times.

Figure 7A:
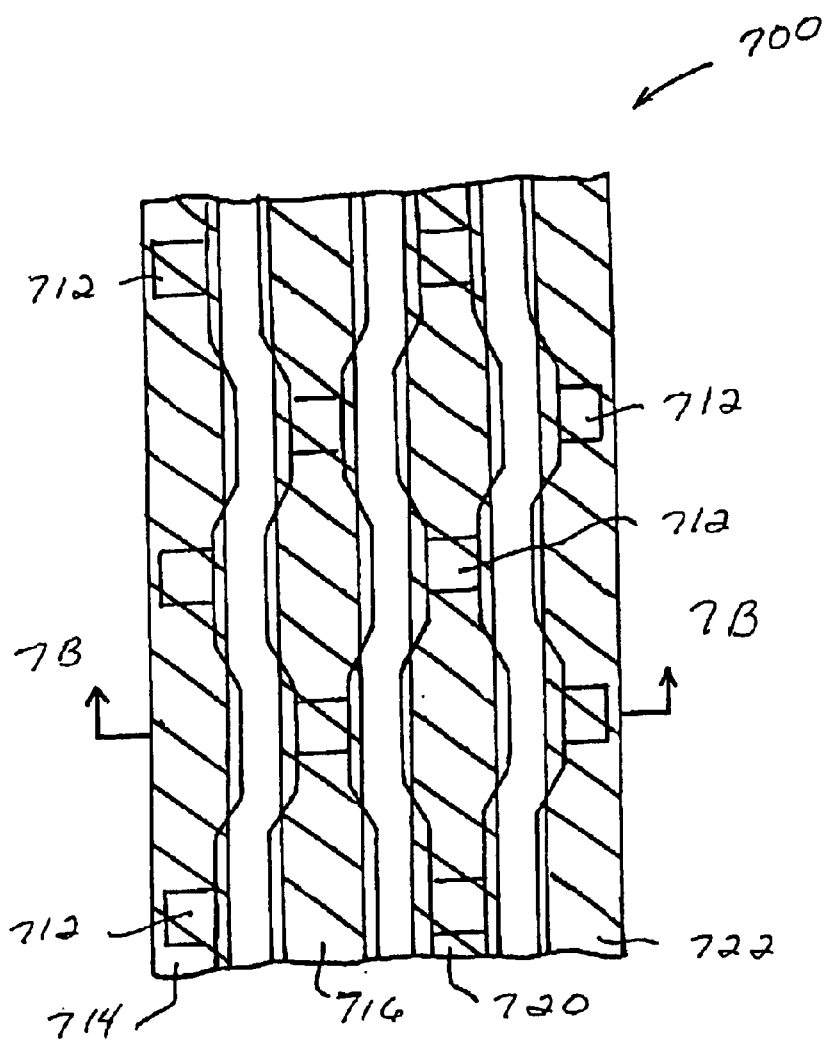
FIGS. 7A–7B are two views illustrating a layout 700 of PMOS transistor M0 after the metal-2 layer has been formed and patterned in accordance with the present invention. FIG.
Figure 7B:
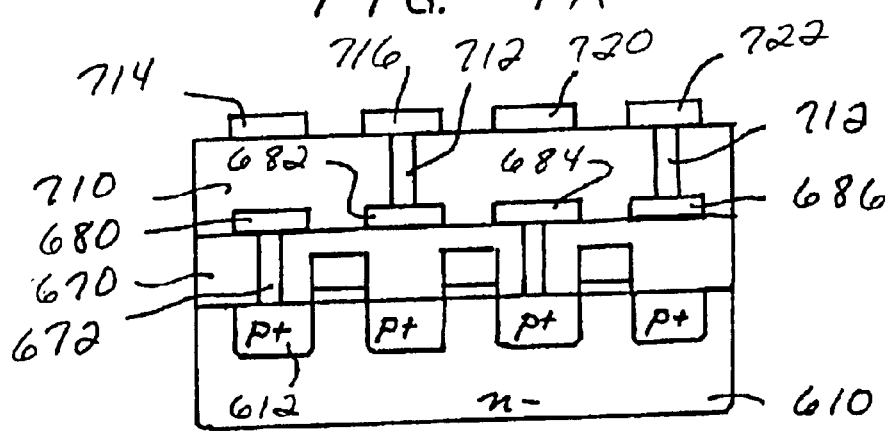

FIGS. 7A–7B show two views that illustrate a layout 700 of PMOS transistor M0 after the metal-2 layer has been formed and patterned in accordance with the present invention. FIG. 7A shows a plan view, while FIG. 7B shows a cross-sectional view taken along lines 7B–7B of FIG. 7A. As shown in FIGS. 7A–7B, layout 700 is the same as layout 600 except that layout 700 shows the additional formation of a layer of isolation material 710, vias 712 that are formed through isolation layer 710, and a plurality of strips of metal-2.

The metal-2 strips include a source strip 714, a drain strip 716, a source strip 720, and a drain strip 722. Source strip 714 is formed on isolation material 710 to make electrical contact with the vias 712 that make an electrical connection with source strip 780.

Drain strip 716 is formed on isolation material 710 to make electrical contact with the contacts 712 that make an electrical connection with drain strip 682. Source strip 720 is formed on isolation material 710 to make electrical contact with the contacts 712 that make an electrical connection with p+ source strip 684.

Drain strip 722 is formed on isolation material 712 to make electrical contact with the contacts 712 that make an electrical connection with drain strip 686. (Although not shown, a metal-2 interconnect strip is formed over the metal-1 interconnect strip 688 and electrically connected by vias.)

Figure 8A:
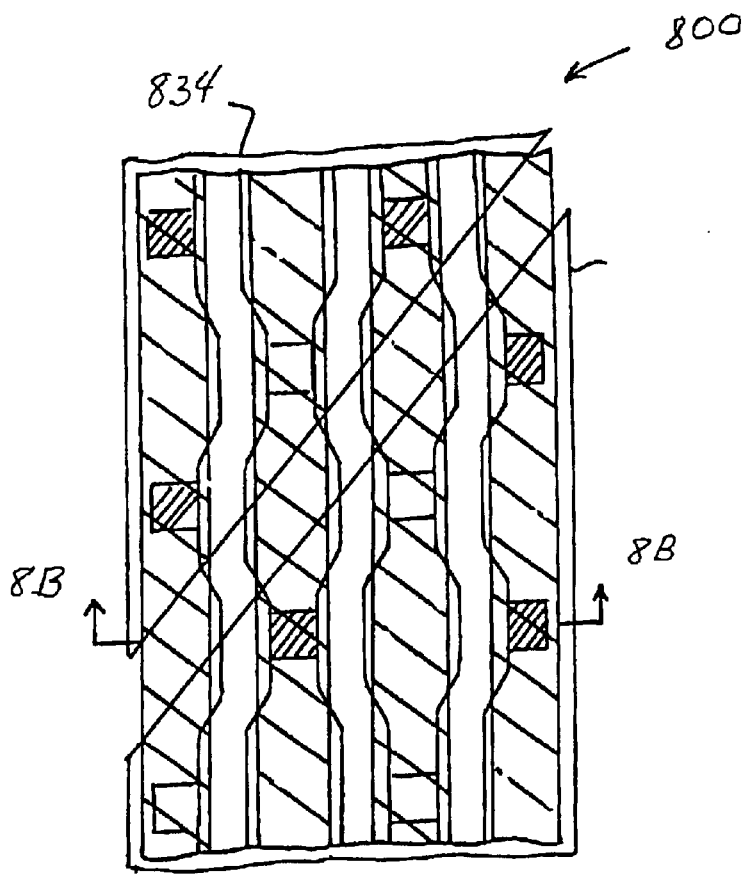
FIGS. 8A–8B are two views illustrating a layout 800 of PMOS transistor M0 after the metal-4 layer has been formed and patterned in accordance with the present invention.
Figure 8B:
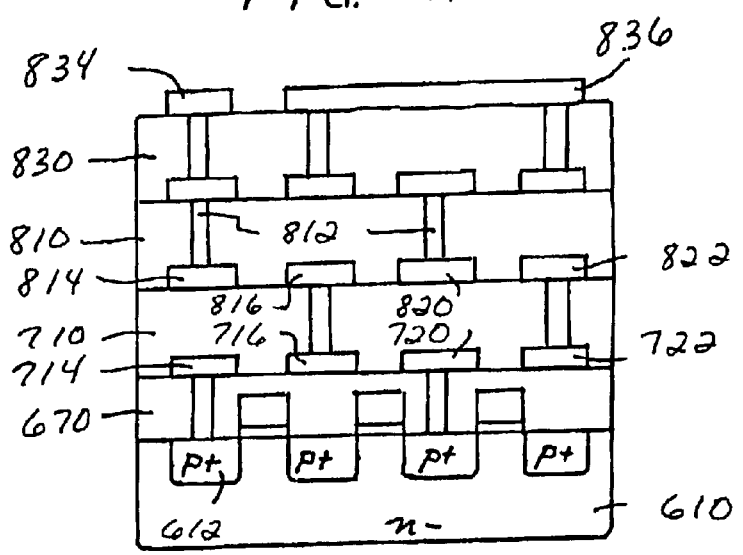

FIGS. 8A–8B show two views that illustrate a layout 800 of PMOS transistor M0 after the metal-4 layer has been formed and patterned in accordance with the present invention. FIG. 8A shows a plan view, while FIG. 8B shows a cross-sectional view taken along lines 8B—8B of FIG. 8A. As shown in FIGS. 8A–8B, layout 800 is the same as layout 700 except that layout 800 shows the additional formation of a layer of isolation material 810, vias 812 that are formed through isolation layer 810, and a plurality of strips of metal-3.

The metal-3 strips include a source strip 814, a drain strip 816, a source strip 820, and a drain strip 822. Source strip 814 is formed on isolation material 810 to make electrical contact with the vias 812 that make an electrical connection with source strip 714. Drain strip 816 is formed on isolation material 810 to make electrical contact with the vias 812 that make an electrical connection with drain strip 716.

Source strip 820 is formed on isolation material 810 to make electrical contact with the contacts 812 that make an electrical connection with p+ source strip 720. Drain strip 822 is formed on isolation material 810 to make electrical contact with the vias 812 that make an electrical connection with drain strip 722. (Although not shown, a metal-3 interconnect strip is formed over the metal-2 interconnect strip and electrically connected by vias.)

Layout 800 shows the additional formation of a layer of isolation material 830, vias 832 that are formed through isolation layer 830, and two triangles of metal-4. The metal-4 triangles include a source triangle 834 and a drain triangle 836. Source triangle 834 is formed on isolation material 830 to make electrical contact with all of the vias 812 that make an electrical connection with metal-3 source strips, including source strips 814 and 820. Drain triangle 836 is formed on isolation material 830 to make electrical contact with all of the vias 832 that make an electrical connection with metal-3 drain strips, including drain strips 816 and 822.

Figure 9:
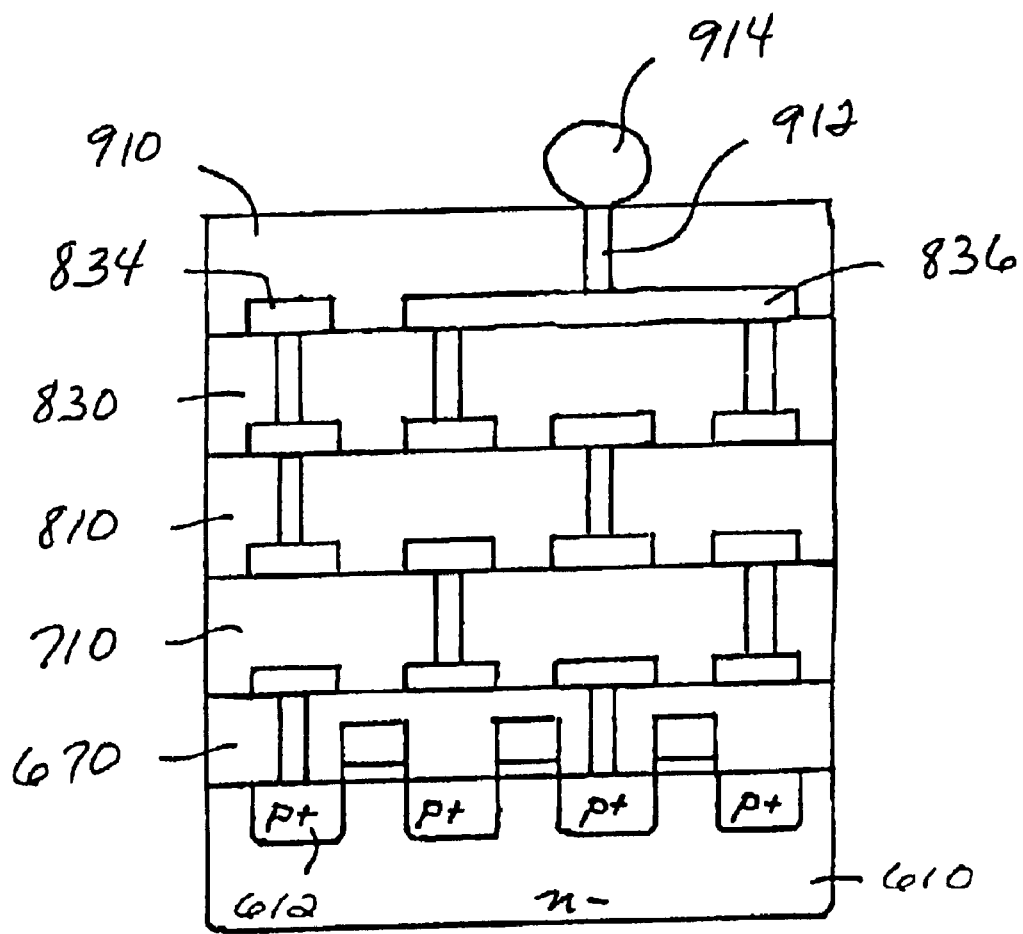
FIG. 9 is a cross-sectional view taken along lines 8B—8B of FIG. 8A illustrating a layout 900 after the formation of solder balls in accordance with the present invention.

FIG. 9 shows a cross-sectional view taken along lines 8B—8B of FIG. 8A that illustrates a layout 900 after the formation of solder balls in accordance with the present invention. As shown in FIG. 9, layout 900 is the same as layout 800 except that layout 900 shows the additional formation of a layer of isolation material 910, vias 912 that are formed through isolation layer 910, and a plurality of solder balls 914. Solder balls 914 are formed as big balls to minimize parasitic contributions to the source-to-drain turn on resistance of PMOS transistor M0.

Other than differing conductivity types (e.g., n+ source and drain regions in lieu of p+ source and drain regions), the layout of transistor M5 of FIG. 1 is the same as the layout of transistor M0 of FIG. 1. In accordance with an alternate embodiment of the present invention, the contacts and vias used in PMOS transistor M0 are larger (wider) than the contacts and vias used in NMOS transistor M5.

As a result, the larger contacts used on PMOS transistor M0 reduce the resistance associated with the contacts. (Larger contacts are not used on the NMOS transistor M5 because the p+ source, n-channel region, and p+ drain form a parasitic bipolar transistor which, in response to transients, can exhibit snapback characteristics if the transients exceed the rail or falls below ground.)

In accordance with a further embodiment of the present invention, the source regions (which correspond with the emitter of the parasitic bipolar transistor) of NMOS transistor M5 are wider than the drain regions of NMOS transistor M5 (while the source and drain regions both have the same length and depth). In this embodiment, the contacts and vias of PMOS transistor M0 are the same size as the contacts and vias of NMOS transistor M5, however, NMOS transistor has more gate strips than PMOS transistor M0.

Increasing the width of the source regions effectively increases the resistance. Since the source regions function as the emitter regions of the parasitic bipolar transistor, increasing the widths of the source regions is equivalent to adding resistance to the emitter of a bipolar transistor.

By ballasting, adding resistance to the emitter, a large number of bipolar transistors can be placed in parallel without one transistor, usually the center one, heating up and hogging the current. Thus, the wider source regions more evenly distribute the current and reduce the likelihood that the parasitic bipolar transistors in NMOS transistor M5 will enter snapback and fail.

Thus, an output driver stage, including the layout of the PMOS driver transistor of the output stage, has been described. The present invention utilizes both circuit techniques (pulling down the well) and layout techniques, (serrated gate structures) to obtain approximately a 25%–35% improvement in the source-to-drain turn on resistance of PMOS transistor M0.

It should be understood that the above descriptions are examples of the present invention, and various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A driver comprising:

a p-channel MOS transistor having a p+ source connected to a supply voltage, a p+ drain connected to a first node, a gate, and an n-bulk connected to a second node;

an n-channel MOS transistor having an n+ source connected to a ground node, an n+ drain connected to the first node, a gate, and a p-bulk connected to a p-bulk voltage;

a gate signal generator that outputs a PMOS gate signal to the gate of the p-channel MOS transistor, an NMOS gate signal to the gate of the n-channel MOS transistor, and a control signal, the PMOS and NMOS gate signals being non-overlapping;

a first switch connected to the control signal, and the n-bulk of the p-channel MOS transistor via the second node;

a second switch connected to the ground node and the control signal; and a resistor that is connected to the n-bulk of the channel MOS transistor, a current flowing through the resistor to the ground node when the second switch is closed, and not flowing when the second switch is open.

2. The driver of claim 1 wherein the control signal has a logic state opposite to the logic state of the PMOS gate signal.

3. The driver of claim 1 and further comprising:

a third switch connected to the second switch and the resistor that is controlled by an enable signal; and a fourth switch connected to the voltage source and the resistor that is controlled by the enable signal.

4. The driver of claim 1 wherein the p+ source includes a plurality of p+ strips formed in the n-bulk, a p+ source strip having a width that varies with length from a first width to a second larger width to the first width.

5. The driver of claim 4 wherein the p+ drain includes a plurality of p+ strips formed in the n-bulk, a p+ drain strip having a width that varies with length from a third width to a fourth smaller width to the third width.

6. The driver of claim 5 wherein a first line normal to the lengths of the p+ source strip and the p+ drain strip passes through the first width and the third width, the third width being larger than the first width.

7. The driver of claim 6 wherein a second line normal to the lengths of the p+ source strip and the p+ drain strip passes through the second width and the fourth width, the second width being larger than the first width.

8. The driver of claim 7 and further comprising a plurality of first channel region strips, a first channel region strip located between adjacent p+ source and drain strips, the first channel region strip having a shape that varies with length, the shape being defined by the ascent n+ source and drain strips; and a plurality of first gate strips, a first gate strip formed over each first channel region strip, the first gate strip having a shape that varies with length and substantially matches the shape of the first channel region strip.

9. The driver of claim 8 and further comprising:

a region of field oxide; and an interconnect line formed on the region of field oxide.

10. The driver of claim 9 wherein each end of a gate strip is connected to the interconnect line.

11. The driver of claim 8 wherein the n+ source includes a plurality of n+ strips formed in the p-bulk, an n+ source ship having a width that varies with length from a fifth width to a sixth larger width to the fifth width.

12. The driver of claim 11 wherein the n+ drain includes a plurality of n+ strips formed in the p-bulk, a n+ drain strip having a width that varies with length from a seventh width to an eighth smaller width to the seventh width.

13. The driver of claim 12 wherein a third line normal to the lengths of the n+ source ship and the n+ drain strip passes through the fifth width and the seventh width, the seventh width being larger than the fifth width.

14. The driver of claim 13 wherein a second line normal to the lengths of the n+ source strip and the n+ drain strip passes through the sixth width and the eighth width, the sixth width being larger than the eighth width.

15. The driver of claim 14 and further comprising a plurality of second channel region strips, a second channel region strip located between adjacent n+ source and drain strips, the channel region strip having a shape that varies with length, the shape belong defined by the adjacent n+ source and drain strips; and
a plurality of second gate strips, a second gate strip formed over each second channel region strip, the second gate strip having a shape that varies with length and substantially matches the shape of the second channel region strip.

16. The driver of claim 15 and further comprising:
a plurality of first contacts electrically connected to the p+ source and drain strips; and
a plurality of second contacts electrically connected to the n+ source and drain strips, the first contacts being larger than the second contacts.

17. The driver of claim 15 wherein:
the n+ source strips have a first maximum width; and
the n+ drain strips have a second maximum width that is larger than the first maximum width.

18. A method of driving a signal with a driver, the driver having:
a p-channel MOS transistor having a p+ source connected to a supply voltage, a p+ drain connected to a first node, a gate, and an n-bulk connected to a second node;
an n-channel MOS transistor having an n+ source connected to a ground node, an n+ drain connected to the first node, a gate, and a p-bulk connected to a p-bulk voltage;
a first switch connected to the control signal, and the n-bulk of the p-channel MOS transistor via the second node;
a second switch connected to the ground node and the control signal; and
a resistor that is connected to the n-bulk of the p-channel MOS transistor, a current flowing through the resistor to the ground node when the second switch is closed, and not flowing when the second switch is open,
the method comprising the steps of:
turning off the n-channel MOS transistor;
turning on the p-channel MOS transistor after the n-channel MOS transistor has been turned off; and
connecting the n-bulk to the ground node via the resistor when the p-channel MOS transistor is on.

19. The method of claim 18 and further comprising the steps of:
turning off the p-channel MOS transistor;
connecting the n-bulk to a voltage greater than ground when the p-channel transistor is off; and
turning on the n-channel MOS transistor.

20. A driver comprising:
a first transistor having a first semiconductor material of a first conductivity type, first spaced-apart diffusion regions of a second conductivity type formed in the first semiconductor material, a first channel located between the first spaced-apart diffusion regions, and a first gate formed over and isolated from the first channel, the first semiconductor material being connected to a first node, a first diffusion region of the first spaced-apart diffusion regions being connected to a second node, a second diffusion region of the first spaced-apart diffusion regions being connected to a third node;
a second transistor having a second semiconductor material of the second conductivity type, second spaced-apart diffusion regions of the first conductivity type formed in the second semiconductor material, a second channel located between the second spaced-apart diffusion regions, and a second gate formed over and isolated from the second channel, the second semiconductor material being connected to a fourth node, a first diffusion region of the second spaced-apart diffusion regions being connected to the second node, a second diffusion region of the second spaced-apart diffusion regions being connected to a fifth node;
a gate signal generator that outputs a first gate signal to the first gate of the first transfer, a second gate signal to the second gate of the second transistor, and a control signal; and
a first switch connected to the first node and the third node, and to receive the control signal.

21. The driver of claim 20 and further comprising a second switch connected to the fifth node, and to receive the control signal.

22. The driver of claim 21 and further comprising a resistive device connected to the first node and the second switch.

23. The driver of claim 22 wherein the resistive device is further connected to the third node.

24. The driver of claim 20 wherein the first switch induces a third transistor having third spaced-apart diffusion regions of the second conductivity type, a third channel located between the third spaced-apart diffusion regions, and a third gate formed over and isolated from the third channel, a first diffusion region of the third spaced-apart diffusion regions being connected to the first node, a second diffusion region of the third spaced-apart diffusion regions being connected to the third node, the third gate being connected to receive the control signal.

25. The driver of claim 21 wherein:
the first switch includes a third transistor having third spaced-apart diffusion regions of the second conductivity type, a third channel located between the third spaced-apart diffusion regions, and a third gate formed over and isolated from the third channel, a first diffusion region of the third spaced apart diffusion regions being connected to the first node, a second diffusion region of the third spaced-apart diffusion regions being connected to the third node, the third gate being connected to receive the control signal; and
the second switch includes a fourth transistor having fourth spaced-apart diffusion regions of the first conductivity type, a fourth channel located between the fourth spaced-apart diffusion regions, and a fourth gate formed over and isolated from the fourth channel, a first diffusion region of the fourth spaced-apart diffusion regions being connected to the fifth node, the fourth gate being connected to receive the control signal.

26. The driver of claim 21 wherein the first and second gate signals are non-overlapping.

27. The driver of claim 26 wherein the gate signal generator induces:
- a third transistor having third spaced-apart diffusion regions of the second conductivity type, a first diffusion region of the third spaced-apart diffusion regions being connected to the first gate, the third transistor having a first area;
- a fourth transistor having fourth spaced-apart diffusion regions of the first conductivity type, a first diffusion region of the fourth spaced apart diffusion regions being connected to the first gate, the fourth transistor having a second area;
- a fifth transistor having fifth spaced apart diffusion regions of the second conductivity type, a first diffusion region of the fifth spaced apart diffusion regions being connected to the second gate, the fifth transistor having a third area; and
- a sixth transistor having sixth spaced-apart diffusion regions of the first conductivity type, a first diffusion region of the sixth spaced-apart diffusion regions being connected to the second gate, the sixth transistor having a fourth area, the first area being substantially larger than the third area, the second area being substantially larger than the fourth area.

28. The driver of claim 27 wherein the first area is substantially larger than the second area.

29. The driver of claim 21 wherein the control signal has a logic state opposite to the logic state of the first gate signal.

30. The driver of claim 21 and further comprising:
- a third switch connected to the second switch, and to receive an enable signal; and
- a fourth switch connected to the first node and the third node, and to receive the enable signal.

31. The driver of claim 30 and further comprising a resistive device connected to the first node, the third switch, and the fourth switch.

32. The driver of claim 31 wherein the resistive device is further connected to the third node.

* * * * *

UNITED STATES PATENT AND TRADEMARK OFFICE
CERTIFICATE OF CORRECTION

PATENT NO.     : 6,744,288 B1
DATED          : June 1, 2004
INVENTOR(S)    : Doyle et al.

It is certified that error appears in the above-identified patent and that said Letters Patent is hereby corrected as shown below:

Replace title page, with the attached title page.

Please delete drawing sheets Figures 1-9 and insert replacement sheets Figures 1-9.

<u>Column 4,</u>
Line 42, delete "Invention" and replace with -- invention --.

<u>Column 6,</u>
Line 3, delete "dosed" and replace with -- closed --.

<u>Column 7,</u>
Line 46, delete "ship" and replace with -- strip --.

<u>Column 9,</u>
Line 29, delete "MO" and replace with -- M0 --.

<u>Column 10,</u>
Line 24, delete "channel" and replace with -- p-channel --.
Line 57, delete "ascent" and replace with -- adjacent --.

<u>Column 11,</u>
Lines 3 and 10, delete "ship" and replace with -- strip --.
Line 20, delete "belong" and replace with -- being --.

<u>Column 12,</u>
Line 26, delete "transfer" and replace with -- transistor --.
Line 39, delete "induces" and replace with -- includes --.
Line 55, delete "spaced apart" and replace with -- spaced-apart --.

UNITED STATES PATENT AND TRADEMARK OFFICE
CERTIFICATE OF CORRECTION

PATENT NO. : 6,744,288 B1
DATED : June 1, 2004
INVENTOR(S) : Doyle et al.

It is certified that error appears in the above-identified patent and that said Letters Patent is hereby corrected as shown below:

Column 13,
Line 4, delete "induces" and replace with -- includes --.
Lines 12, 15 and 17, delete "spaced apart" and replace with -- spaced-apart --.

Signed and Sealed this

Fifth Day of April, 2005

JON W. DUDAS
*Director of the United States Patent and Trademark Office*

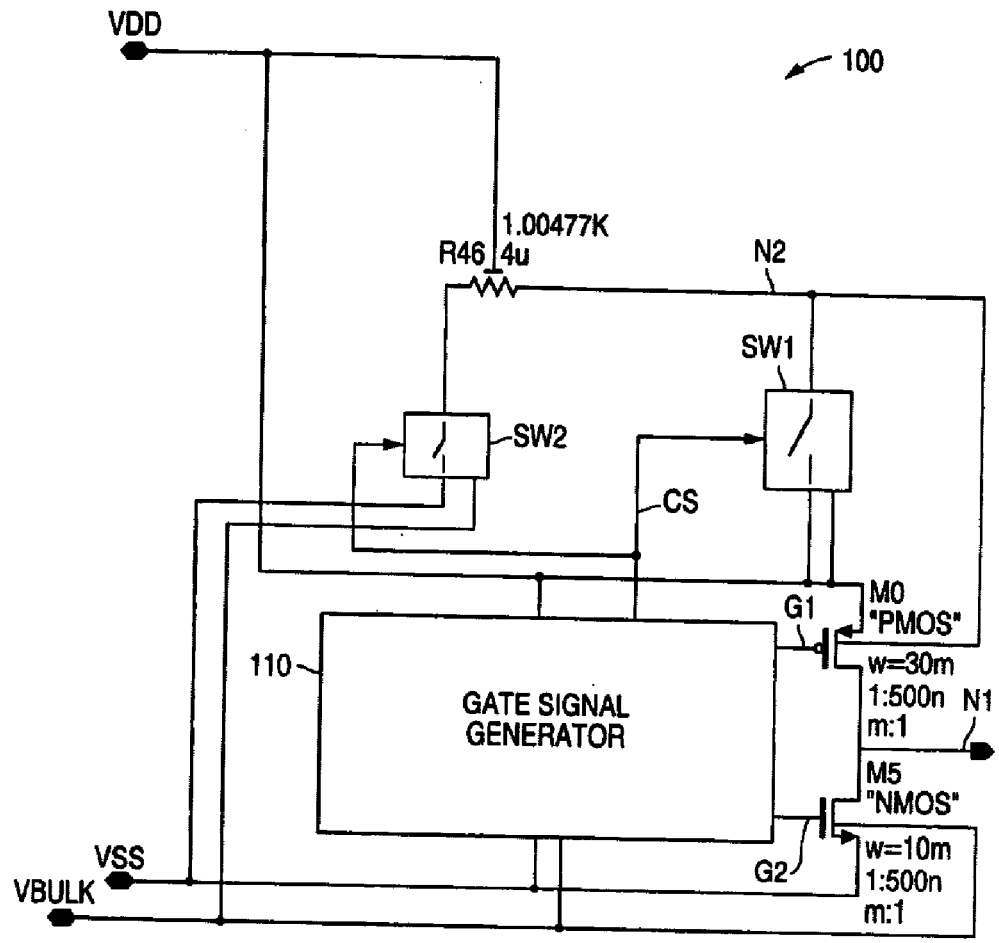
FIG. 1
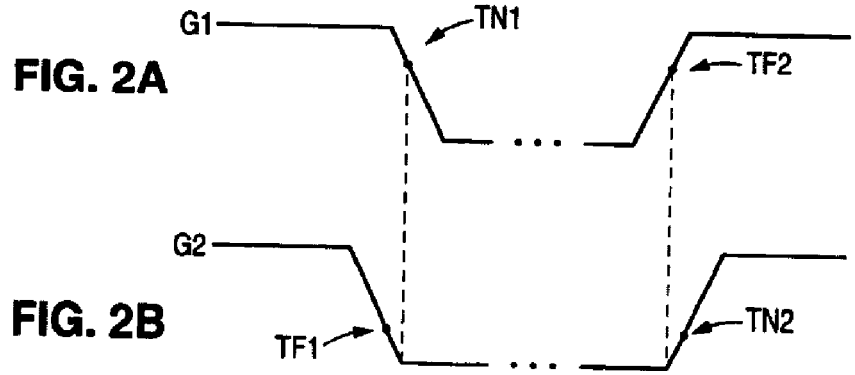
FIG. 2A
FIG. 2B

FIG. 4A  FIG. 4B